United States Patent [19]

Sethi et al.

[11] Patent Number: 5,573,973
[45] Date of Patent: Nov. 12, 1996

[54] INTEGRATED CIRCUIT HAVING A DIAMOND THIN FILM TRENCH ARRANGEMENT AS A COMPONENT THEREOF AND METHOD

[75] Inventors: Rakesh B. Sethi, Campbell; Cheng-Chen Hsueh, Sunnyvale, both of Calif.

[73] Assignee: National Semiconductor Corporation, Santa Clara, Calif.

[21] Appl. No.: 339,970

[22] Filed: Nov. 14, 1994

Related U.S. Application Data

[63] Continuation-in-part of Ser. No. 34,560, Mar. 19, 1993, abandoned.

[51] Int. Cl.⁶ .................................................. H01L 21/76
[52] U.S. Cl. ................... 437/67; 437/977; 148/DIG. 50; 148/DIG. 138
[58] Field of Search .............................. 437/67, 68, 919, 437/977; 148/DIG. 50, DIG. 138

[56] References Cited

U.S. PATENT DOCUMENTS

| | | | |
|---|---|---|---|
| 4,925,701 | 5/1990 | Jansen et al. | 427/38 |
| 5,087,959 | 2/1992 | Omori et al. | 257/77 |
| 5,229,310 | 7/1993 | Sivan | 437/41 |
| 5,313,094 | 5/1994 | Beyer et al. | 257/622 |

FOREIGN PATENT DOCUMENTS

| 04106923 | 4/1992 | Japan | 257/77 |
|---|---|---|---|

OTHER PUBLICATIONS

Isotopic effects in a-C:(H/D) films deposited from methane/hydrogen RF plasmas, D. Boutard and W. Moller, Materials Research Society, J. Mater, Res., vol. 5, No. 11, Nov. 1990.

Primary Examiner—Trung Dang
Attorney, Agent, or Firm—Hickman Beyer & Weaver

[57] ABSTRACT

An integrated circuit based on submicron technology is disclosed herein along with the way in which it is formed. The integrated circuit is comprised of an arrangement of different substances which are combined to form its body structure and which define within the body structure an array of electronic components including a diamond thin film coated trench arrangement. In one embodiment disclosed herein, the array of electronic component includes two such components which are in close proximity to and must be electrically isolated from one another and the diamond thin film coated trench arrangement serves to electrically isolate these two components from each other. In a second embodiment, the diamond thin film coated trench is specifically designed to serve as a capacitor forming part of, for example, a DRAM, a mixed signal circuit or a neuro-fuzzy circuit.

18 Claims, 5 Drawing Sheets

INTEGRATED CIRCUIT HAVING A DIAMOND THIN FILM TRENCH ARRANGEMENT AS A COMPONENT THEREOF AND METHOD

CROSS REFERENCE TO RELATED APPLICATION

This application is a continuation-in-part of the copending U.S. application Ser. No. 08/034,560 filed Mar. 19, 1993 now abandoned which is incorporated herein by referenced in its entirety.

BACKGROUND OF THE INVENTION

The present invention relates generally to integrated circuits and their formation, and more particularly to the formation of diamond thin film trench for use as a capacitor forming part of, for example, a DRAM in a bipolar, C-MOS or other such submicron integrated circuit or as a means for electrically isolating adjacent electronic components of such a circuit, for example adjacent transistors.

The formation of integrated circuits using bipolar, C-MOS or other such submicron technology is well known in the art. As an example, FIG. 1 diagramatically illustrates part of an integrated circuit 10 which has been formed in accordance with conventional prior art practices. This integrated circuit is shown including, among other components, a pair of adjacent transistors T1 and T2 formed within a cooperating tub or well 12 of p or n doped silicon which, in turn, is established in a silicon or other suitable dielectric substrate. The field oxide is grown on a suitable silicon or other such substrate (not shown). In order to ensure that the two transistors T1 and T2 function reliably and independently, they must be electrically isolated from one another. Theretofore, one common way of accomplishing this was to form a relatively thick layer of field oxide, for example on the order of 5000 Å, between the adjacent transistors. More recently, in order to scale down the bipolar, C-MOS and other such submicron technologies to levels below 0.5 micron levels, it has been necessary to scale down the field oxide islands that isolate p and n wells or separate electronic components within the same tub or well. In high density gate/memory arrays, the scaling has forced designers to move away from field arrays to fieldless arrays. As a result, rather than establishing a layer of field oxide between wells or electronic components such as transistors T1 and T2 in the case of integrated circuit 10, the use of an isolation trench arrangement has been proposed more recently. Such a trench arrangement is shown in FIG. 1 at 16. This arrangement includes a trench which is cut or otherwise formed by standard means, specifically by means of reactive ion etching. Once the trench is established, successive layers of silicon dioxide (or other such composite dielectric capable of being 10 deposited or thermally grown) and nitride 18 and 20 are grown on the walls within the trench and the latter is then filled with polysilicon, undoped TEOS or other suitable dielectric substance 22 in order to planarize the overall arrangement, as illustrated in FIG. 1.

The same type of trench configuration described immediately above has been proposed heretofore in the formation of storage capacitors for use as part of DRAMs. However, in the case where the trench arrangement is to be used as a capacitor, the internal trench walls are ion-implanted with the appropriate dopant which forms the bottom plate of the capacitor before the silicon dioxide and nitride layers 18 and 20, respectively, are formed and the trench is filled with polysilicon which serves as the top plate or electrode of the capacitor.

While isolation trench arrangement and capacitor trench arrangements of the types described immediately above may be improvements over the use of the field oxides in scaled down integrated circuit technologies, they do have certain drawbacks. In the case of isolation trench arrangement 16, the trench and specifically the oxide/nitride layers are located directly adjacent the n +or p +junctions of its adjacent transistors. When the transistors are biased, active (high electron) trapping takes place at the well (silicon)/ trench (silicon oxide) interface. This, in turn, can cause junction walk-out which means that the breakdown of the junction will actually change as the device is turned on, thereby causing it to turn on at different voltages, for example 5 volts at one time and 5.6 volts at another time. In the case of the trench capacitor arrangement described above, the relatively low dielectric constant of the silicon dioxide forming part of the capacitor severely limits its storage capacity and severely limits the speed of the DRAM which includes the capacitor.

An unsuccessful conventional attempt to form a diamond coated trench in a semiconductor substrate will be described with reference to FIGS. 2a–e. Initially, a surface of a semiconductor wafer 222 is covered with a photoresistive material. Selected sections of the photoresist are exposed and developed by photolithography. The developed photoresist is then removed to leave a hard mask pattern 220 of unexposed photoresist on the wafer 222 as shown in FIG. 2a.

The semiconductor wafer surface is then bombarded by ions in a highly anisotropic reactive ion etching to form a trench masked out by the hard mask 222. The ions eat away silicon in the wafer substrate while leaving the photoresist essentially unscathed. During trench formation, the reactive ion etching may impart some random roughness on a trench bottom surface. However, the roughness is not predetermined or controlled. Standard photoresist solvents burn off residual photoresist in a cleaning or "ashing". The resulting trench 224 with a bottom surface 226 is shown in FIG. 2b.

Diamond 228 is applied non-selectively to the wafer 222 to the cover the trench 228 and on numerous areas over the wafer surface outside the trench as shown in FIG. 2c. Chemical vapor deposition, acetylene torch, and decomposition methods all deposit diamond both inside and outside the trench.

A photoresist mask 230 is then applied to cover the diamond coated trench. The removal of diamond from planar surfaces is well know within the art to be an extremely difficult problem. The unwanted diamond on the outside areas is removed by any of various strong wet or dry etching techniques such as sputtering while the mask 230 prevents diamond 228 in the trench from being etched away. Unfortunately, the strong etchings damage the substrate 222 and thus worsen the isolation problems which the trench formation was supposed to improve. The mask formed in step 211 is removed in step 213 to leave a diamond coated trench. The process 200 ends in a step 214.

FIG. 2e illustrates the resulting diamond coated trench 224. "Stringer" diamond fragments 232 remain about the trench lip. The strong etchings which remove the diamond outside the trench 224 leave damage areas 234 on the wafer surface. The diamond 228 in the trench is not guaranteed to have a uniform thickness.

The resulting trench and substrate in FIG. 2e are in practice not useful in integrated circuits. The stringers 232 can easily break away from the lip during integrated circuit manufacture and cause serious contamination problems. Even if the stringer problem were overcome, the trench 224 could not be used as an isolation trench because the damaged areas 234 degrade component isolation rather than improve it. The trench 224 would also fail in a capacitor arrangement both because of the damaged areas 234 and because the thickness of the diamond cannot be predetermined.

A method of forming a diamond coated trench which could selectively deposit a uniform diamond layer with a predetermined thickness would be advantageous. By selectively forming diamond only in the trench, the stringer and substrate damage problems from etching away diamond from surfaces outside the trench would be obviated. If a uniform, predetermined diamond layer thickness could be selected and then applied to the trench, accurate integrated circuit capacitors could be made using diamond as the trench capacitor dielectric. The disadvantages of silicon oxide and silicon nitride capacitors mentioned above would be avoided.

SUMMARY OF THE INVENTION

As will be seen hereinafter, applicants have modified this trench technology in a way which eliminates the drawbacks described immediately above. Specifically, there is disclosed herein an integrated circuit comprising an arrangement of different substances which are combined to form its body structure and which, in accordance with the present invention, define within the body structure and array of electronic components including a diamond thin film coated trench arrangement. In accordance with one embodiment of the present invention, the array of electronic components includes two such components which are in close proximity to and must be electrically isolated from one another, for example adjacent transistors, and the diamond thin film coated trench arrangement is disposed between these two components and serves to electrically isolate them from one another. In accordance with a second embodiment of the present invention, the diamond thin film coated trench arrangement is designed to serve as a capacitor forming part of, for example, a DRAM, a mixed signal circuit or a neuro-fuzzy circuit. In either embodiment, the diamond thin film coated trench arrangement is formed in accordance with the present invention by first forming the trench itself in such a way that its inner trench walls are rough. In that way, the diamond thin film can be caused to selectively nucleate onto the rough surface through the use of a standard chemical vapor deposition process.

The utilization of a diamond thin film in the isolation trench arrangement minimizes the active trapping problem discussed above. In addition, the diamond/Si interface (at the well) is inactive compared to the $SiO_2$/Si interface of the prior art, thereby improving radiation hardness. Moreover, the use of the diamond thin film reduces low field d.c. leakage between intra-junctions within the well (suppression of thermally generated corners). Further, it has a much higher dielectric constant than silicon dioxide and therefore its use as part of the trench capacitor arrangement forming part of an overall DRAM, as described above, results in greater storage capacity and a much faster DRAM, as much as 54% faster.

BRIEF DESCRIPTION OF THE DRAWINGS

The present invention will be described in more detail below in conjunction with the drawings, wherein.

DETAILED DESCRIPTION OF ILLUSTRATIVE EMBODIMENTS

Figure 1:
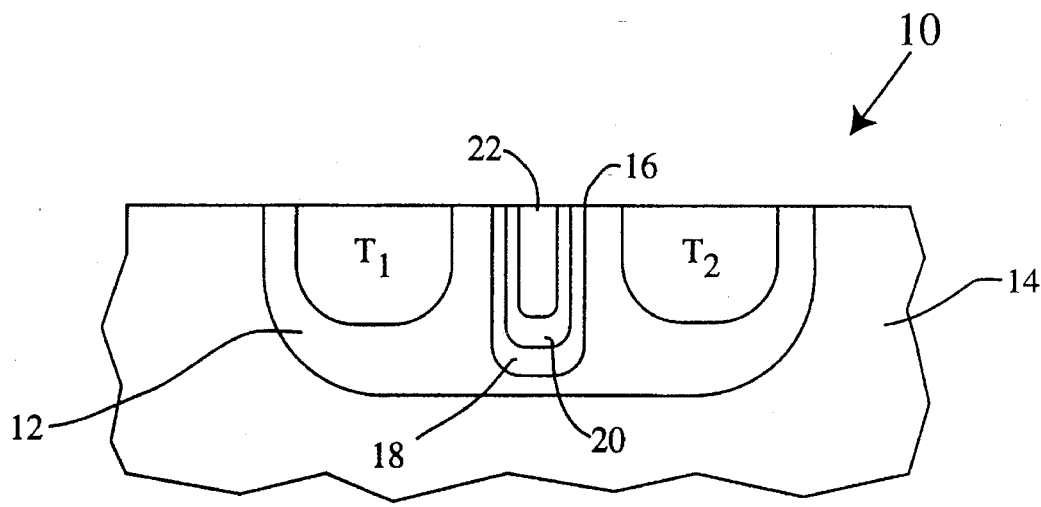
FIG. 1 is a diagrammatic illustration, in elevational view, of a submicron integrated circuit designed and formed in accordance with the prior art.

Turning now to the drawings, attention is briefly redirected to FIG. 1 which, as just stated, diagrammatically illustrates a submicron integrated circuit designed in accordance with the prior art. As described previously, this integrated circuit includes a pair of adjacent transistors T1 and T2 separated from one another by means of an isolation trench arrangement 16, all of which are formed within a p or n doped silicon well 12 which, in turn, is established within an undoped silicon substrate 14. It is to be understood that the various details of integrated circuit 10 and the way in which the integrated circuit is formed are well known in the art and, therefore, have been omitted for purposes of clarity and brevity. This approach is also being taken in the description of the conventional components making up the integrated circuits designed in accordance with the present invention and illustrated in FIGS. 2 and 3.

Figure 3:
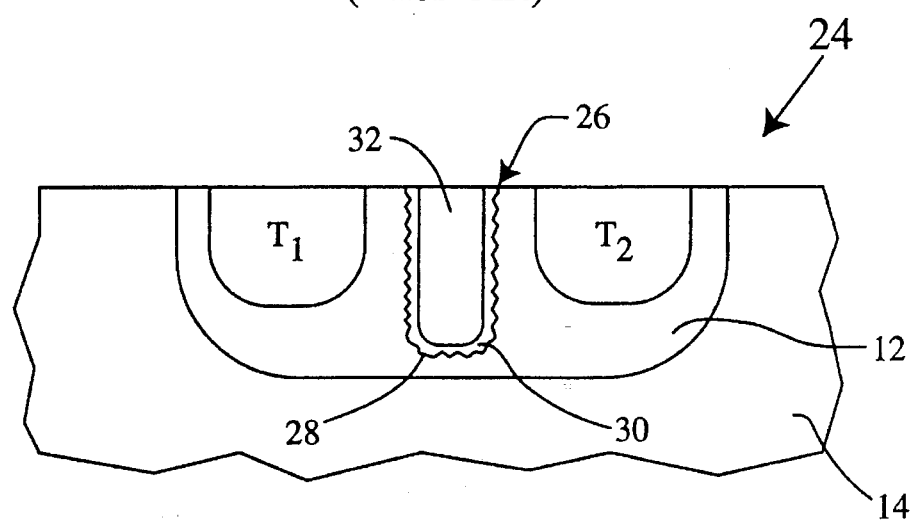
FIG. 3 is diagrammatic illustration, in elevation view, of a submicron integrated circuit designed and formed in accordance with one embodiment of the present invention.

Turning to FIG. 3, an integrated circuit 24 designed in accordance with one embodiment or aspect of the present invention is illustrated. This integrated circuit, like circuit 10, is based on bipolar, C-MOS or other such well known submicron technology. Moreover, like integrated circuit, like circuit 10, integrated circuit 24 includes, among other components, a pair of adjacent transistors T1 and T2 formed within a p or n doped silicon well 12 which, in turn, is established within an undoped silicon or other such dielectric substrate 14. Integrated circuit 24 also includes a trench arrangement 26 for electrically isolating the transistors T1 and T2 from one another. However, trench arrangement 26, unlike trench arrangement 16, is designed in accordance with the present invention. Specifically, this trench arrangement includes a trench 28 having its inner exposed walls coated with a diamond thin film 30 as shown in FIG. 3. The trench is then filled with polysilicon 32, undoped TEOS, or any other suitable dielectric in order to planarize the trench. Trench arrangement 26 may be formed in the manner described previously and it has the advantages over trench arrangement 16, as previously recited.

Figure 4:
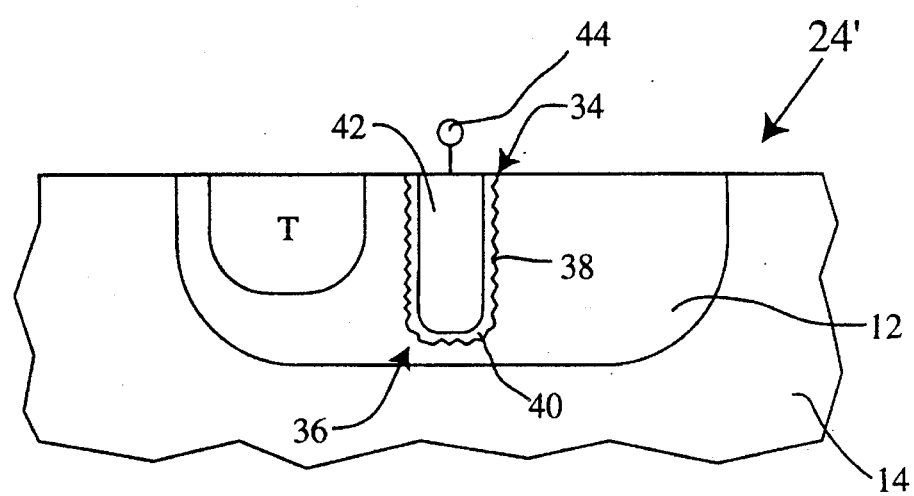
FIG. 4 is a diagrammatic illustration, in elevational view, of a submicron integrated circuit designed in accordance with a second embodiment of the present invention.
Figure 2A:
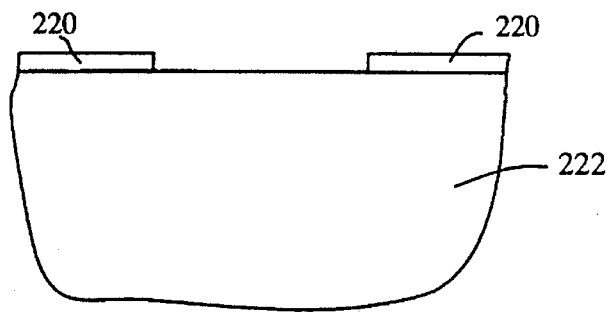
FIGS. 2a–e diagrammatically illustrate, in elevational view, an unsuccessful conventional attempt to for a diamond isolation trench in a semiconductor substrate for use in submicron integrated circuit.
Figure 2B:
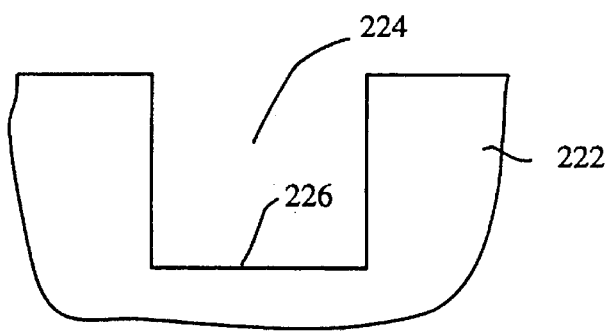
Figure 2C:
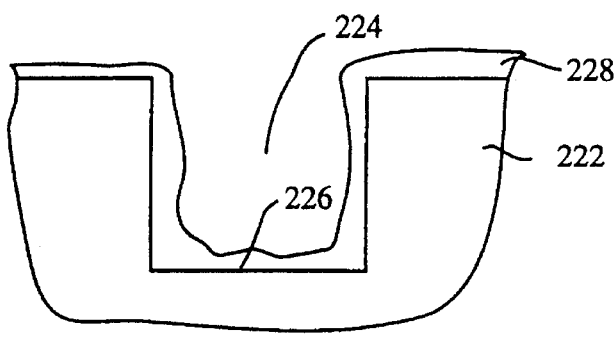
Figure 2D:
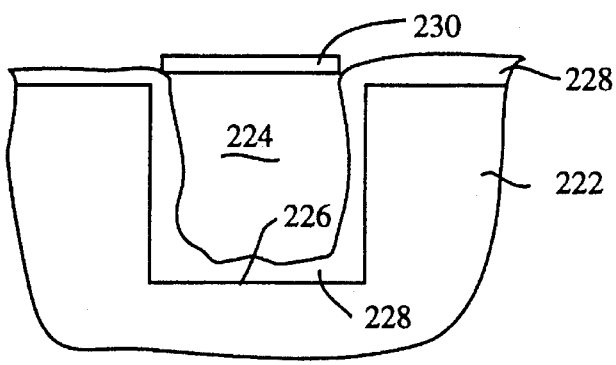
Figure 2E:
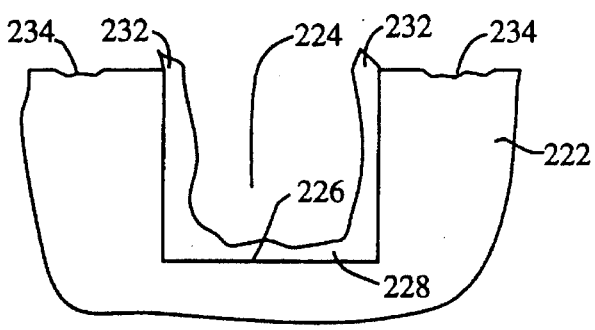

Turning now to FIG. 4, attention is directed to a modified integrated circuit 24' or it could be a different section of the same integrated circuit 24. In either case, the integrated circuit of FIG. 4 is shown including a transistor T and trench capacitor arrangement 34 which together form an overall DRAM 36 within p or n doped silicon well 12 which, in turn, is established within silicon or other such dielectric substrate 14. The trench capacitor arrangement 34 is designed in accordance with the present invention. Specifically, it is comprised of a trench 38 having roughened inner walls coated with a diamond thin film 40 after the trench walls have been implanted with the appropriate dopant to form the bottom plate of the capacitor. Thereafter, the trench is filled with polysilicon 42 which serves as an electrode or top plate 44 for the capacitor. While not shown, silicon dioxide/nitride layers can be provided between the diamond thin film and polysilicon. This trench capacitor arrangement may be formed in the manner described previously and displays the previously recited advantages over prior art trench capacitors.

While the above-described method of forming a diamond coated trench is adequate, the following embodiments may be preferred. While the roughening techniques will be described in the context of forming a diamond coated trench for use in an integrated circuit, the techniques extend to other semiconductor environments and used for other purposes where accurate grain size roughnesses are required. For example, very small areas can be roughened to form sharp dendritic high electron injection electrodes, and inverse trench capacitors can be made from roughened silicon islands coated with diamond.

The following preferred embodiments etch a trench into a semiconductor wafer. This initial etching may form trench surfaces with random surface roughnesses. Afterwards, a trench bottom surface is roughened uniformly regardless of any roughness imparted in the initial etching. Then, trench sidewalls are roughened uniformly. Halogen plasma etchings are currently preferred to roughen uniformly the trench bottom surface and sidewalls. Diamond is then selectively nucleated on the rough surfaces in the trench. By selectively forming diamond only in the trench, the stringer and substrate damage problems caused by etching diamond off of surfaces outside the trench in conventional attempts are obviated. Since the trench surfaces have uniform, predetermined roughnesses, diamond film thicknesses can be preselected and implemented. Accurate integrated circuit trench capacitors can thus be made with the resulting trench.

Figure 5:
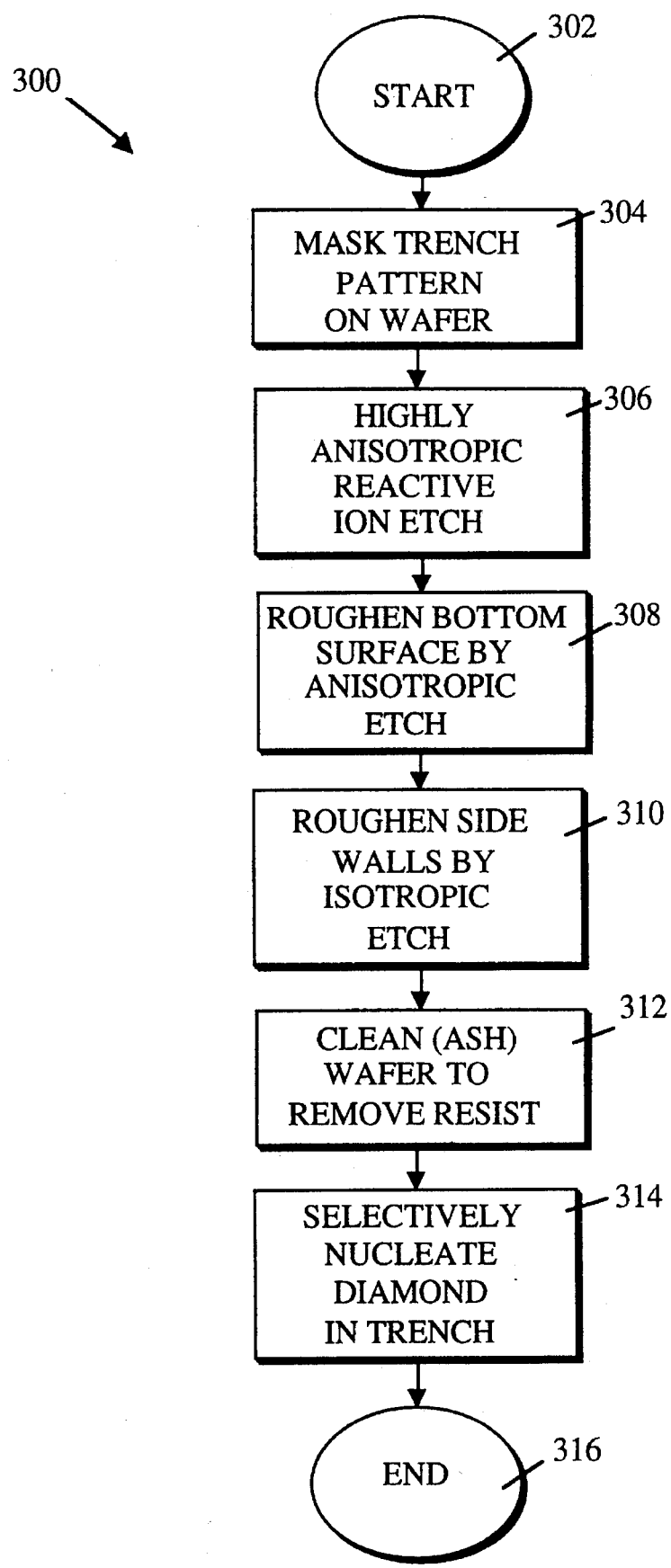
FIG. 5 is a flowchart illustrating a process for making a diamond coated trench in a semiconductor substrate for use in a submicron integrated circuit in accordance with a third embodiment of the present invention.

FIG. 5 is a flowchart illustrating a process 300 for preparing a semiconductor substrate having a diamond coated trench arrangement in accordance with a third embodiment of the present invention beginning at a step 302. Initially, masking material delineating a trench pattern is masked on a circumferential top surface segment on the semiconductor substrate or wafer in a step 304. Conventional photoresist patterning methods described with reference to FIG. 2a may be used in step 304 to apply a photoresist masking material. Subsequently, a highly anisotropic etching such as reactive ion etching is used in step 306 to form the trench although reactive ion etching is not the only method for forming the bare trench in the wafer. In a typical application, the trench will be between 2 and 20 microns deep in a wafer about 18 mils thick, and the photoresist layer will be about 1 micron thick. Of course, other trench depths, wafer thicknesses, and photoresist thicknesses are permitted.

While step 306 may produce some unpredictable roughness of the bottom surface of the trench, it is incapable of imparting a uniform predetermined roughness to either the trench's bottom surface or sidewalls. Given a desired uniform predetermined roughness for the bottom surface of the trench step 308, roughens the bottom surface to match the predetermined roughness. In a preferred embodiment, a halogen gas mixture or plasma anisotropically (vertically) etches the trench bottom surface. As used herein, the term "halogen" will be considered to include bromine, chlorine, fluorine, iodine, and astatine. As examples, suitable halogen mixtures include, but are not limited to, Lowry-Brønsted acids (e.g. HBr, HCl, etc.), Lewis acids (e.g. $BCl_3$, $AlCl_3$, etc.), and the halogens themselves (e.g. $Cl_2$, $I_2$, etc.). A hydrogen bromide/chlorine mixture is currently preferred. The use of halogens for anisotropic etching is well known to those skilled in the art. However, halogens have not previously been used to roughen surfaces to a predetermined grain size or to assist in selective nucleation.

The masking material applied to the circumferential top surface segment of the wafer prevents the plasma from etching outside the trench. A hydrogen bromide/chlorine gas mixture in a ratio less than about 1-to-1 is presently preferred for step 308. By varying the power applied to the halogen gas mixture to produce the plasma, the etching time, the plasma pressure within a plasma etching chamber, and the wafer temperature, the predetermined bottom surface roughnesses can be achieved. For example, 200 watts applied to a hydrogen bromide/chlorine plasma in a 1-to-1 ratio for 40 seconds will produce an average grain size roughness of about 300 angstroms on the trench bottom surface.

In the art, an "endpoint" etch is defined to cease once a level of a particular substance is detected in the plasma gases. For the present use, an endpoint etch can be programmed to stop when a specified silicon level is detected in plasma chamber exhaust gases. A "timed" etch refers to an application of electrical power to the gas or plasma for a specified time. Presently, a timed etch is preferred over an endpoint etch for step 308.

In a preferred embodiment, a halogen gas mixture or plasma is also used to apply a predetermined, uniform roughness to the trench sidewalls in step 310. As examples, suitable halogen mixtures include, but are not limited to, Lowry-Brønsted acids (e.g. HBr, HCl, etc.), Lewis acids (e.g. $BCl_3$, $AlCl_3$, etc.) and the halogens themselves (e.g. $Cl_2, I_2$, etc.). A hydrogen bromide/chlorine mixture is currently preferred. The use of halogens for isotropic etching is well known to those skilled in the art. However, as noted above, halogens have not previously been used to roughen surfaces to a predetermined grain size or to assist in selective nucleation. A timed etch is also presently preferred for step 310. As with step 308, varying the power applied to the gas to form the plasma, exposure time, gas ratios, and wafer temperature determines the uniform roughness formed on the sidewalls in step 310.

A hydrogen bromide/chlorine plasma requires a ratio greater than about 1-to-1 to perform isotropic etching. For example, silicon nodules in the sidewalls with grain sizes between about 50 to 200 angsttoms may be formed by a hydrogen bromide/chlorine ratio of about 1.2-to-1 at a pressure of 250 millitorr for a wafer at 100° C. Silicon grain sizes in the range 100–500 angstroms can be produced by a 1.6-to-1 hydrogen bromide/chlorine gas ratio at 200 millitorr for a wafer at 100° C. Grain sizes greater than 500 angstroms can be produced by a hydrogen bromide/chlorine ratio of 2-to-1 at 100 millitorr for a 50° C wafer. Two-hundred watts applied for 200 seconds to a hydrogen bromide/chlorine plasma in a 2- to-1 ratio produces grain sizes in the 300–600 angstroms range. The isotropic etching in step 310 will only roughen the sidewalls and will not affect the trench's bottom surface. Preferably, the trench bottom surface and sidewalls will have equal roughnesses to provide a uniform capacitance per unit area within the trench.

It is emphasized that steps 308 and 310 not only produce well defined uniform roughnesses for selective diamond deposition in later steps, they also produce well-defined surface areas over the inside of the trench. Therefore, capacitors having well-defined, predetermined capacitances can be fabricated with the trenches. As integrated circuits are made smaller, it is difficult to maintain storage capacity for trench capacitors. The predetermined roughnesses increase the capacitor plate areas for the very small trenches thereby permitting larger capacitances than otherwise possible. Thus, the roughening steps 308 and 310 simultaneously contribute to solving the diamond deposition problem within the trenches and also the capacitance problem associated with making smaller isolation trenches and smaller capacitors.

The etching steps 308 and 310 roughen the trench walls and bottom thereby exposing different facets of silicon to create a grain size roughness. In a preferred embodiment, the etching plasmas also create dangling atomic bonds in the trench sidewalls. The dangling bonds are not generic to any rough surface but are specific to the plasma etchings' creation of empty electron states in the silicon wafer atoms. In a sense, the dangling bonds are a type of roughness on atomic and molecular scales.

Preferred etching plasmas in steps 308 and 310 and/or gases, such as methane, in a subsequent selective diamond nucleation step may deposit hydrogen on the rough bottom surface and rough sidewalls. The hydrogen is strongly attracted to the empty electrons states left on the rough bottom and sidewall surfaces in the silicon wafer, and it readily bonds with the rough surfaces. Carbon is also strongly attracted to the dangling bonds and to the hydrogen clinging to the bottom and sidewalls. Once carbon attaches to the hydrogen and rough silicon surfaces, it in turn attracts more carbon. Essentially, the hydrogen and carbon act as "glue layers"for carbon deposition.

Therefore, the present invention permits diamond and diamond-like carbon to be selectively nucleated in the trench not only by grain size roughness but also by dangling bond roughness. The selective grain size roughening and dangling bonds on the trench sidewalls and bottom both individually and collectively accelerate nucleation of diamond and diamond-like carbon films in the trench. As explained above, the dangling bonds created by the roughening act as termination sites for diamond molecules to promote the faster nucleation.

Resist masking material is removed from the wafer in step 312, and a diamond layer is selectively formed inside the trench in step 314. Because the steps 308 and 310 have roughened the bottom and sidewall surfaces uniformly, the selective nucleation in step 314 forms a diamond layer uniformly on the bottom surface and uniformly on the sidewalls. If the grain sizes on the bottom surface and sidewalls are the same, the thickness of the diamond layer will be the same on the bottom surface and the sidewalls. Because only the inside of the trench is rough, the nucleation in step 314 selectively deposits the diamond only inside the trench and not outside the trench. A presently preferred selective diamond nucleation method is chemical vapor deposition (CVD) using a methane gas.

Therefore, the conventional steps of covering a trench with a photoresist mask, removing diamond from areas outside the trench, and removing the mask covering the trench are obviated, and the stringer and substrate damage problems caused by conventional processes are solved. By simultaneously having a well-defined surface area over the inside of the trench and having a well-determined diamond layer thickness, capacitors formed from the diamond coated trench created in step 314 will have well-defined capacitances. Step 314 is capable of forming a diamond layer thickness of 1000 Angstroms or less for isolation trenches and trench capacitors although thicker layers may be formed if desired. The process 300 ends at a step 316.

Figure 6A:
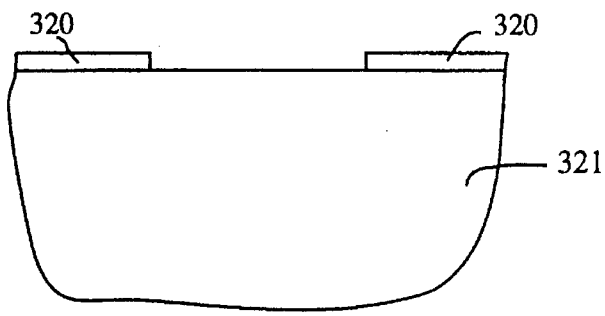
FIG. 6a–e diagrammatically illustrate, in elevational view, formation of a diamond coated trench in a semiconductor substrate for use in submicron integrated circuit using the process illustrated in FIG. 4.

FIGS. 6a–e illustrate the process 300 for forming the diamond coated trench. FIG. 6a shows the result of step 304 of forming a masking material 320 on a semiconductor wafer 321. The masking material may be photoresist. In the context of integrated circuit trenches, the masking material may be any material preventing the roughing the circumferential top surface segment surrounding the trench and is not limited to photoresist. The subsequent anisotropic etching step 306 only effects areas of the wafer 321 not covered by the masking material 320.

Figure 6B:
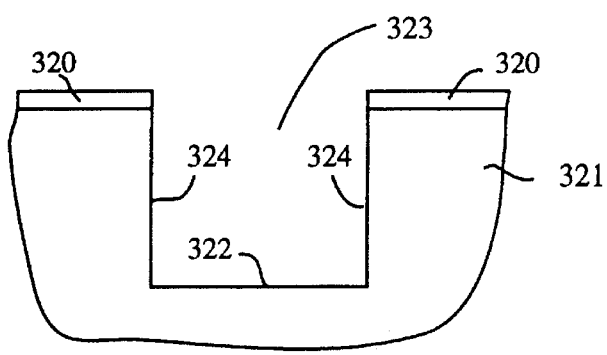

FIG. 6b shows the semiconductor wafer 321 with a trench 323 produced by step 306. Photoresist 320 remains on the wafer surface. The trench 323 has a bottom surface 322 and sidewalls 324 formed by anisotropic etching 306. Sidewalls 324 will generally be smooth because the anisotropic etching 306 etches the semiconductor wafer 321 vertically. The bottom surface 322 may have some random roughness from the anisotropic etching 06.

Figure 6C:
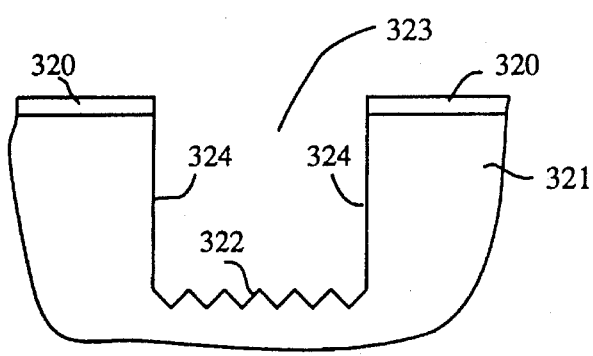

FIG. 6c shows the trench with a rough bottom surface 322 resulting from the vertical anisotropic etching step 308. The roughness shown in FIG. 6c is exaggerated for illustration. As described above, halogen plasma etching using gas mixtures such as hydrogen bromide/chlorine are presently preferred for step 308. Regardless of the random roughness applied by the reactive ion etching 306, step 308 imparts a uniform, predetermined roughness to the bottom trench surface 322. The masking material 320 prevents the halogen plasma etching 308 from roughening the circumferential top surface segment of the wafer about the trench 323.

Figure 6D:
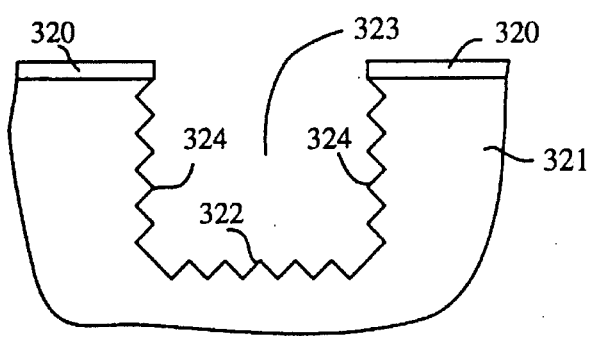

Rough sidewalls 324 resulting from step 310 are shown in FIG. 6d. As in FIG. 6c. the roughnesses in FIG. 6d are exaggerated for illustration. Preferably, a halogen plasma etching roughens the sidewalls 324. Step 310 roughness sidewalls 324 without affecting the bottom surface roughness. When step 310 uses a hydrogen bromide/chlorine plasma, the gas ratio is adjusted so that only the sidewalls 324 are roughened by step 310. Of course, since the roughnesses caused by steps 310 and 310 are essentially orthogonal, step 310 may occur before step 308 yet produce a trench with the same sidewall and bottom surface roughnesses from step 308 followed by step 310.

Figure 6E:
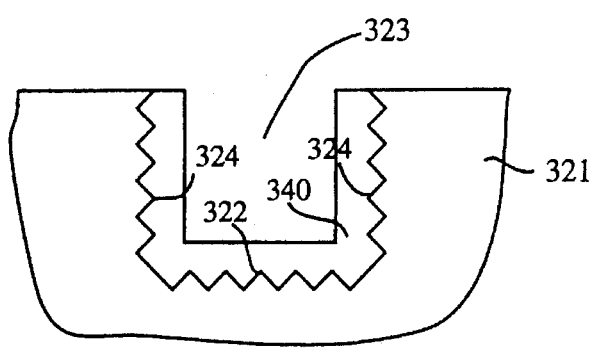

After removing the mask 320 in step 312, a uniform diamond thin film layer 340 is selectively nucleated in step 314 onto the rough bottom surface 322 and sidewalls 324 to form the diamond coated trench 323 shown in FIG. 6e. The diamond layer thickness is exaggerated in FIG. 6e. Any suitable selective nucleation technique may selectively nucleate the trench rough surfaces with diamond or diamond-like carbon. Chemical vapor deposition (CVD) is presently preferred for step 314. By varying the ratio of elements in the CVD gas, the diamond or diamond-like carbon 340 deposited on the trench surfaces may be made an insulating diamond thin film. Isolation trenches and trench capacitors require insulating diamond films. Generally, the masking material 320 will be removed after the reactive ion etching 306 and the vertical roughening 308 but before the diamond trench is used within the body structure of the integrated circuit. When the uniform, predetermined roughnesses on the bottom surface 322 and sidewalls 324 are the same, the diamond layer will be uniform. If the sidewalls 324 have one uniform, predetermined roughness and the bottom surface 322 has another, then the diamond layer 340 will be selectively nucleated with one thickness on the sidewalls 324 and another thickness on the bottom surface 322.

After the diamond thin film coated trench 323 has been formed in process 300, conventional C-MOS techniques may be used to form an integrated circuit having a diamond thin film coated trench within its body structure. Since the trench is in the integrated circuit's substrate, it will be submerged beneath several conductive, dielectric, and metallization layers. A dielectric passivation layer is lastly formed on top of all the layers over the semiconductor with substrate.

Figure 7:
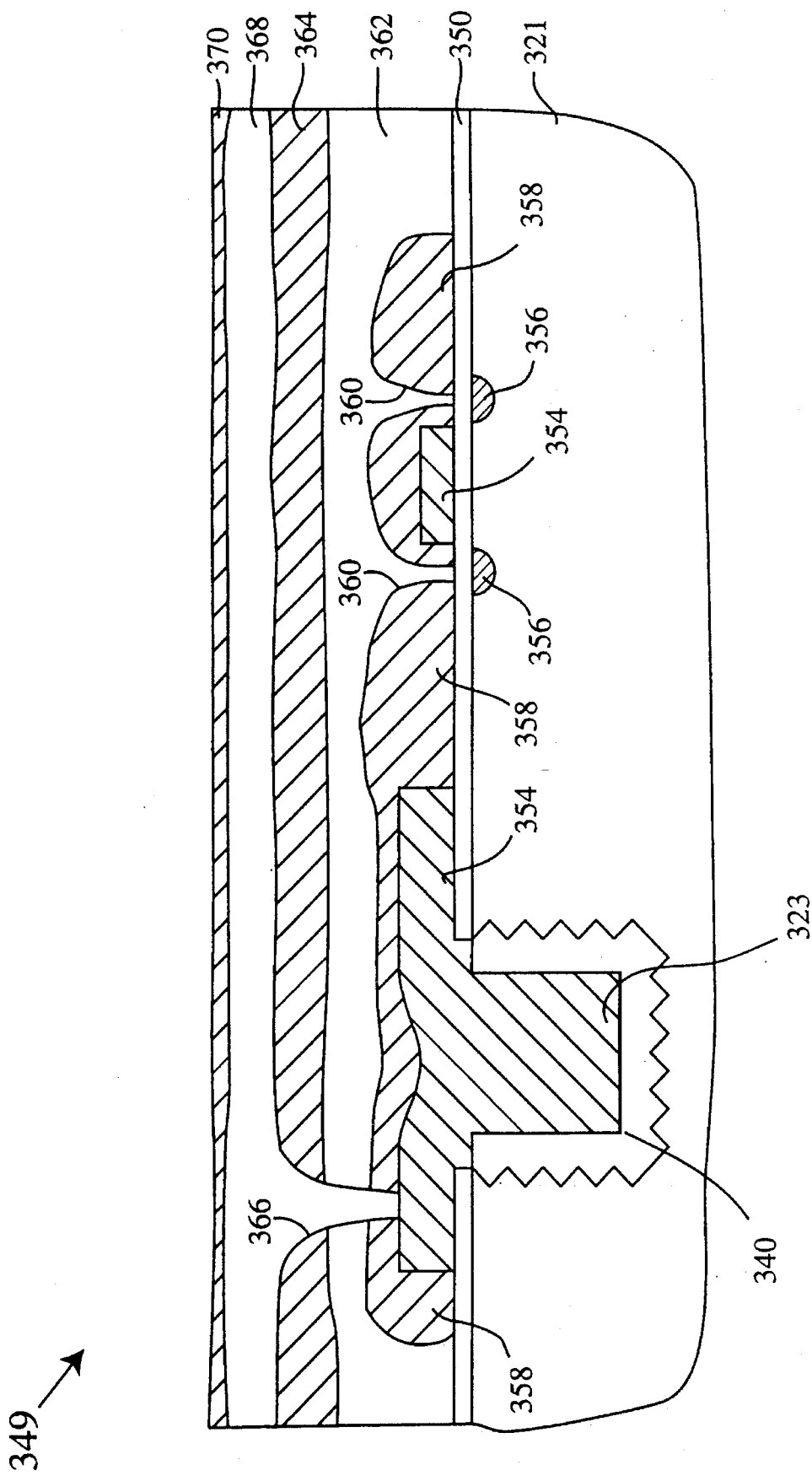
FIG. 7 is a diagrammatic illustration, in elevational view, of an integrated circuit containing a submerged diamond coated trench in accordance with a fourth embodiment of the present invention.

The diamond coated trench 323 used in a capacitor in a source and drain circuit in accordance with a fourth embodiment of the present invention is illustrated in FIG. 7. Conventional C-MOS techniques can be applied to the diamond coated trench arrangement of the present invention to form the a C-MOS integrated circuit 349 shown in FIG. 6. One first forms gate oxides 350 on the substrate 321 to form active areas. Gate polysilicon 354 is then applied to make transistor gates and to planarize the trench 323. Source and drain contacts 356 are then formed by self aligning to the gate polysilicon 354. Then, a first dielectric layer 358 is deposited over the resulting arrangement. Typically, the first dielectric is boron phosphate silicate glass (BPSG) although other suitable dielectrics may be used. Via holes 360 are then cut in the first dielectric layer 358, and a first metallization layer 362 is applied over the dielectric 358. During its application, metal in the first metallization layer 362 flows into the via holes 360 through the first dielectric layer 358 to contact the source and drain gates 356. A second dielectric layer 364 is formed on top of the first metallization layer 362 and via holes 366 are cut into the second dielectric layer similar to the holes 360 in the first dielectric layer 356. BPSG is also generally used for the second dielectric layer 364. A second metallization layer 368 is then applied over the second dielectric layer 364. Finally, a dielectric passivation layer 370 is formed over the second metallization layer 368 to complete the construction of the integrated circuit 349. While only a few layers have been described as being between the trench in the substrate and the passivation layer, there are generally 15 to 20 layers of polysilicon, first dielectric, metal one, second dielectric, metal two, and intermetal layers.

The diamond coated trench has many uses. For example, mixed signal circuits use digital and analog signals within the same circuit. Therefore, they require capacitors that can store charge precisely. Trenches using silicon oxides and nitrides tend to trap charges over time causing the "walkout" effect. Diamond does not trap charges. Neuro-fuzzy circuits have analog signals. They require substantial amounts of non-volatile memory to store various charge levels not simply discrete levels corresponding to zero and one. The precise capacitance permitted by diamond coated trenches results in faster neuro-fuzzy circuits.

While only a few embodiments of forming a diamond coated trench in a semiconductor substrate have been described, it should be appreciated that various other embodiments may be used without departing from the spirit and scope of the present invention. For example, it may be desirable to roughen only the bottom trench surface or only the sidewalls. When both the bottom and sides walls are roughened, the sidewalls may be roughened before the bottom surface is roughened. In addition, the surfaces may be roughened for other purposes besides the deposition of diamond, and the surfaces do not need to reside in trenches. For example, reverse trench islands for maximizing DRAM capacitors may be roughened using the present invention to maximize capacitance per unit area. Therefore, the present examples are to be considered as illustrative and not restrictive, and the invention is not to be limited to the details herein, but may be modified within the scope of the appended claims.

In the claims:

1. In the manufacture of an integrated circuit including a semiconductor substrate, a method of preparing said semiconductor substrate having a diamond coated trench, the method comprising the steps of:

etching a trench in a semiconductor substrate such that said trench has a bottom surface and sidewalls surrounded by a circumferential top surface segment of said semiconductor substrate;

uniformly toughening said bottom surface and said sidewalls;

prior to roughening at least said bottom surface, masking on said circumferential top surface segment a masking material such that said circumferential top surface segment is prevented from being toughened; and selectively nucleating a diamond layer on said rough bottom surface and on said rough sidewalls inside said trench.

2. A method of preparing a semiconductor substrate as recited in claim 1 wherein said masking step occurs before said etching step and wherein said etching step is a reactive ion etching.

3. A method of preparing a semiconductor substrate as recited in claim 2 further comprising cleaning said semiconductor substrate after said reactive ion etching to remove said masking material.

4. A method of preparing a semiconductor substrate as recited in claim 1 wherein said roughening step has separate steps for roughening said bottom surface and said sidewalls.

5. A method of preparing a semiconductor substrate as recited in claim 4 wherein said bottom surface roughening is performed by a first process distinct from a second process performing said sidewall roughening.

6. A method of preparing a semiconductor substrate as recited in claim 5 wherein said bottom surface roughness and said sidewall roughness are substantially the same such that said nucleating step forms said diamond layer evenly over said rough bottom surface and said rough sidewalls.

7. A method of preparing a semiconductor substrate as recited in claim 6 wherein said bottom surface toughening step is a plasma etching which uses a halogen gas mixture to roughen said bottom surface.

8. A method of preparing a semiconductor substrate as recited in claim 7 wherein said halogen gas mixture contains at most about one pan hydrogen bromide per one pan chlorine such that said bottom surface roughening is an anisotropic etching.

9. A method of preparing a semiconductor substrate as recited in claim 8 wherein said anisotropic etching of said bottom surface occurs for power in a range of about 100 to 300 watts applied to said halogen gas mixture for about 20 to 150 seconds.

10. A method of preparing a semiconductor substrate as recited in claim 9 wherein said semiconductor substrate is at a temperature between about 90 degrees Celsius and 150 degrees Celsius during said anisotropic etching.

11. A method of preparing a semiconductor substrate as recited in claim 9 wherein said halogen gas mixture and said semiconductor substrate are inside an etching chamber and said halogen gas mixture is at a pressure between about 100 millitorr and 200 millitorr during said anisotropic etching.

12. A method of preparing a semiconductor substrate as recited in claim 6 wherein said sidewall roughening step uses a halogen gas mixture.

13. A method of preparing a semiconductor substrate as recited in claim 12 wherein said halogen gas mixture contains in the range of about 2 parts to 3 parts hydrogen bromide per one part chlorine such that said sidewall surface roughening is an isotropic etching.

14. A method of preparing a semiconductor substrate as recited in claim 13 wherein isotropic etching of said sidewalls occurs for power in a range of about 100 to 200 watts applied to said halogen gas mixture for about 50 to 150 seconds.

15. A method of preparing a semiconductor substrate as recited in claim 13 wherein said semiconductor substrate is at a temperature between about 90 and 150 degrees Celsius during said isotropic etching.

16. A method of preparing a semiconductor substrate as recited in claim 13 wherein said halogen gas mixture and said semiconductor substrate are inside an etching chamber and wherein said halogen gas mixture is at a pressure between about 50 millitorr and 250 millitorr during said anisotropic etching.

17. A method of preparing a semiconductor substrate as recited in claim 6 wherein said bottom surface roughness and said sidewall roughnesses have average grain sizes in a range between about 300 angstroms and 600 angstroms.

18. A method of preparing a semiconductor substrate as recited in claim 1 wherein said nucleating step uses chemical vapor deposition to form said diamond layer.

* * * * *

UNITED STATES PATENT AND TRADEMARK OFFICE
CERTIFICATE OF CORRECTION

PATENT NO. : 5,573,973
DATED : November 12, 1996
INVENTOR(S) : Sethi et al.

It is certified that error appears in the above-indentified patent and that said Letters Patent is hereby corrected as shown below:

Column 1, line 36, change "Theretofore" to --Heretofore--

Column 3, line 57, change "comers" to --corners--

Column 5, line 61, change "2and" to --2 and--

Column 10, line 23, change "toughening" to --roughening--

Column 10, line 28, change "toughened" to --roughened--

Column 10, line 53, change "toughening" to --roughening--

Column 10, line 58, change first occurrence of "pan" to --part--

Column 10, line 58, change second occurrence of "pan" to --part--

Signed and Sealed this

Fourth Day of March, 1997

Attest:

BRUCE LEHMAN

Attesting Officer

Commissioner of Patents and Trademarks